United States Patent
Proebsting et al.

(10) Patent No.: US 7,085,178 B1
(45) Date of Patent: Aug. 1, 2006

(54) LOW-POWER MEMORY WRITE CIRCUITS

(75) Inventors: Robert J. Proebsting, Sonora, CA (US); Ronald Ho, Mountain View, CA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/045,940

(22) Filed: Jan. 27, 2005

(51) Int. Cl.
*G11C 7/00* (2006.01)

(52) U.S. Cl. .................. 365/189.11; 365/63; 365/190
(58) Field of Classification Search ........... 365/189.11, 365/63, 190
See application file for complete search history.

(56) References Cited

U.S. PATENT DOCUMENTS

| | | | | |
|---|---|---|---|---|
| 5,684,745 A | * | 11/1997 | Kim et al. ............. | 365/189.11 |
| 6,275,430 B1 | * | 8/2001 | Ka ....................... | 365/190 |
| 6,775,168 B1 | * | 8/2004 | Park et al. ............ | 365/189.11 |

* cited by examiner

*Primary Examiner*—Huan Hoang
(74) *Attorney, Agent, or Firm*—Park, Vaughan & Fleming LLP

(57) ABSTRACT

One embodiment of the present invention provides a system that writes to a cell in a memory using a low-voltage-swing signal across a pair of global bit-lines. During operation, the system receives a low-voltage-swing signal across a pair of global bit-lines, which is too low to reliably write the memory cell. Next, the system converts the low-voltage-swing signal to a high-voltage-swing signal, which is adequate to reliably write the memory cell. The system then writes to the memory cell by applying the high-voltage-swing signal across a pair of local bit-lines that are coupled to the memory cell. The use of low-voltage-swing signals on the global bit-lines reduces overall power consumption. Furthermore, in one embodiment of the present invention, the voltage conversion is achieved using a pair of cross-coupled NMOS transistors whose sources are directly or indirectly coupled with the global bit-lines, and whose drains are directly or indirectly coupled with the local bit-lines.

21 Claims, 4 Drawing Sheets

LOW-POWER MEMORY WRITE CIRCUITS

BACKGROUND

1. Field of the Invention

This invention relates to the process of writing to memory. More specifically, this invention relates to the process of writing data into memory using low-voltage-swing signals on global bit-lines.

2. Related Art

Rapid advances in computing technology have made it possible to perform trillions of computational operations each second on data sets that are sometimes as large as a trillion bytes. These advances can be largely attributed to the exponential increase in the size and complexity of integrated circuits.

Unfortunately, in conjunction with the increase in size and complexity, the power consumption of integrated circuits has also increased. As a result, there is a strong need for integrated circuits that consume less power without sacrificing functionality.

Almost every electronic device contains some form of memory. In many scenarios, the power consumption of a memory can limit its applicability to the electronic device. For example, a memory's power consumption can become a limiting factor due to the system's inadequate heat dissipation capabilities. Similarly, due to the scarcity of battery power in a mobile device, a memory's power consumption can become a limiting factor.

Hence, it is very important to find ways to reduce the power consumption of memories within computer systems.

Memory chips are typically organized hierarchically, with individual memory cells grouped together to share data lines. These data lines are called "local bit-lines," and are usually paired as true and complement wires. The cells that are coupled with these local bit-lines are then grouped together to form larger sets such that these larger sets share another pair of true and complement data lines.

This hierarchy of data lines can extend for one or more levels. The data lines at the top of this hierarchy are called "global bit-lines."

During a read operation, individual memory cells drive the local bit-lines, which in turn drive the higher levels of data lines, eventually driving the global bit-lines. During a write operation, the reverse happens: data is driven onto the global bit-lines and from there it appears on successively lower data lines, eventually appearing on the local bit-lines and writing into the memory cells.

Global bit-lines typically use a high-voltage-swing signal for stable (reliable) writes to memory cells and have high capacitances because they span the entire memory array. Moreover, global bit-lines are active on every memory operation. As a result, during writes, global bit-lines can end up using a significant fraction of the memory's power consumption.

Hence, what is needed is a method and apparatus that consumes less power while writing to a memory.

SUMMARY

One embodiment of the present invention provides a system that writes to a cell in a memory using a low-voltage-swing signal across a pair of global bit-lines. During operation, the system receives a low-voltage-swing signal across a pair of global bit-lines. Note that the voltage swing of the low-voltage-swing signal may be less than the voltage swing required for stable (reliable) writes to a memory cell. Next, the system converts the low-voltage-swing signal to a high-voltage-swing signal. Note that the voltage swing of the high-voltage-swing signal can be greater than or equal to the voltage swing required for stable (reliable) writes to the memory cell. The system then writes to the memory cell by applying the high-voltage-swing signal across a pair of local bit-lines that are coupled with the memory cell. Note that by using low-voltage-swing signals instead of high-voltage-swing signals on the long and high-capacitance global bit-lines, the present invention reduces the overall power consumption of the memory.

In a further variation on this embodiment, the system converts the low-voltage-swing signal to a high-voltage-swing signal using a first pair of cross-coupled NMOS (N-channel Metal-Oxide-Semiconductor) transistors.

In a further variation on this embodiment, the sources of the first pair of cross-coupled NMOS transistors are directly or indirectly coupled to the global bit-lines.

In a further variation on this embodiment, the direct or indirect coupling of the sources of the first pair of cross-coupled NMOS transistors is facilitated using a pair of selection transistors having a common gate voltage.

In a further variation on this embodiment, the system converts the low-voltage-swing signal to the high-voltage-swing signal using a second pair of cross-coupled NMOS transistors to quickly discharge a local bit-line in the pair of local bit-lines, thereby quickly creating the high-voltage-swing signal across the pair of local bit-lines.

In a variation on this embodiment, a global bit-line in the pair of global bit-lines is coupled to a plurality of intermediate bit-lines. In a further variation on this embodiment, an intermediate bit-line in the pair of intermediate bit-lines is coupled to a plurality of local bit-lines.

DETAILED DESCRIPTION

Figure 1:
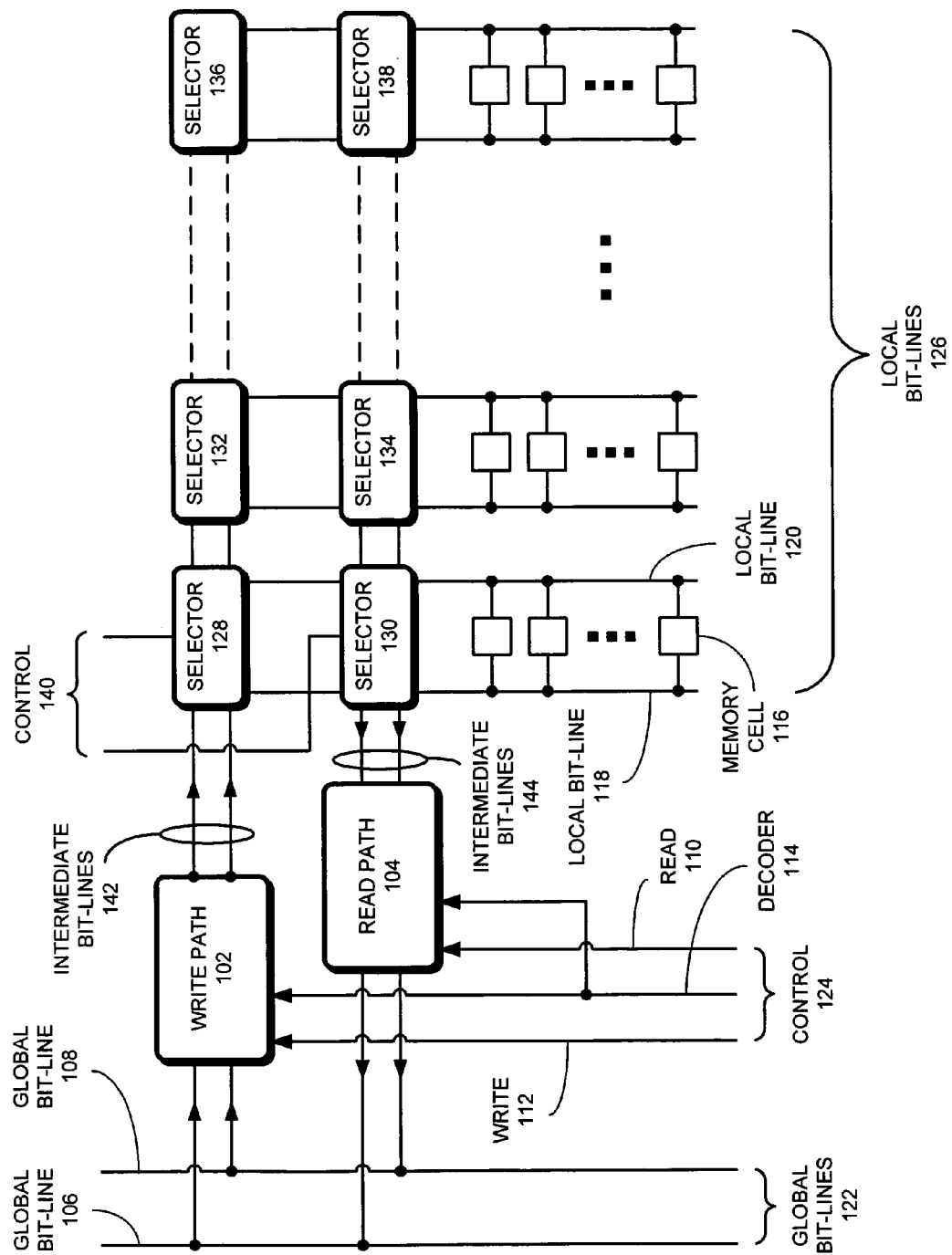
FIG. 1 illustrates a typical conceptual memory interface between a global bit-line and a local bit-line in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Structure of a Memory Chip

Memory chips in a VLSI process are typically organized hierarchically, with individual memory cells grouped together to share data lines. These data lines are called "local bit-lines," and are paired as true and complement wires. The memory cells that are coupled with these local bit-lines are then grouped together to form larger sets, such that these larger sets share another pair of true and complement data lines. This hierarchy of data lines can extend for one or more levels. The data lines at the top of the data line hierarchy are called "global bit-lines."

During a read operation, individual memory cells drive the local bit-lines, which in turn drive the higher levels of data lines, eventually driving the global bit-lines. During a write operation, the reverse happens: data is driven onto the global bit-lines and from there it appears on successively lower data lines, eventually appearing on the local bit-lines and writing into the memory cells.

Global bit-lines typically use a high-voltage-swing signal for stable (reliable) writes to memory cells and have high capacitances because they span the entire memory array. Moreover, global bit-lines are active on every memory operation. As a result, during writes, global bit-lines can end up using a significant fraction of the memory's power consumption.

To reduce power, the signals on these global bit-lines can be switched between lowered voltage supplies. For example, a 1.8V memory may switch its global bit-lines between 0V and 0.3V, thereby potentially saving 97% of the global bit-line power. Note that 1.8V is a representative power supply voltage for an 180 nm CMOS technology. However, for finer line technologies, such as 130 nm, 90 nm, 65 nm, 45 nm, and so oh, the power supply voltage will typically be lower. For example, for 65 nm CMOS, the power supply voltage can be 0.7V. Note that for lower supply voltages, the global bit-line swings can also be reduced from 0.3V to, for example, 0.2V or 0.1V.

Unfortunately, simply reducing the voltage swing of the global bit-lines, intermediate bit-lines, and local bit-lines does not work because the local bit-lines that are coupled with the memory cells require high-voltage-swing signals for stable (reliable) write operations into the memory.

Specifically, for reads, both the local bit-lines—true and complement—are typically pre-charged to a high voltage. But, for writes, only one of these local bit-lines (either the true or the complement, but not both) is pulled down to a low voltage.

Hence, performing a write operation from local bit-lines whose true and complement values are both normally very low (0V and 0.3V, for example) does not work because it results in unreliable writes to the memory cell.

FIG. 1 illustrates a typical conceptual memory interface between a global bit-line and a local bit-line in accordance with an embodiment of the present invention.

The read path 104, carries data from the local bit-lines 126 to the global bit-lines 122. Conversely, the write path 102, carries data from the global bit-lines 122 to the local bit-lines 126. Furthermore, the local bit-lines 126 are coupled with memory cells. For example, local bit-lines 118 and 120 are coupled with memory cell 116.

Note that FIG. 1 illustrates several sets of local bit-lines 126 that share the same read path 104 and write path 102. During operation, the read path 104 or write path 102 must pick the proper set of local bit-lines to use. Note that the read path 104 and the write path 102 are coupled to intermediate bit-lines 144 and 142, respectively. Furthermore, intermediate bit-lines 144 are coupled with a plurality of selectors, namely, selectors 130, 134, and 138. Similarly, intermediate bit-lines 142 are coupled with selectors 128, 132, and 136. These selectors allow intermediate bit-lines to "select" a pair of local bit-lines. For example, selectors 128 and 130 facilitate coupling between intermediate bit-lines 142 and 144, and local bit-lines, such as local bit-lines 118 and 120. Furthermore, these selectors are controlled by control lines, such as control lines 140. (For sake of clarity, we have not illustrated the control lines for selectors 132, 134, 136, and 138. Note that, although we use a single line to illustrate the control line, it will be apparent to one skilled in the art that the single line can be replaced by a plurality of lines to implement the same functionality.) The read path, write path, and the selectors facilitate coupling between the global bit-lines and the local bit-lines. For example, the system can use the write path 102 and the selector 128 to couple the global bit-lines 106 and 108 to the local bit-lines 118 and 120.

For the sake of clarity, we have not illustrated the details of the read path 104, write path 102, and the selectors 128, 130, 132, 134, 136, and 138. It will be apparent to one skilled in the art that a variety of techniques can be used for implementing the functionality of these components.

Note that the read path 104 and the write path 102 are controlled using the control lines 124. The write line 112 is used for enabling the write path 102. Similarly, the read line 110 is used for enabling the read path 104. The decoder line 114 is used for picking the proper set of intermediate bit-lines to use. Note that the decoder line 114 is coupled with both the read path 104 and the write path 102.

Again, for the sake of clarity, we use a single line to illustrate the read line 110, write line 112, and decoder line 114. It will be apparent to one skilled in the art that each of these lines can be replaced by a plurality of lines for implementing the same functionality. For example, the decoder line 114 can be replaced by a plurality of lines that are used by the write path 102 and read path 104 for picking the proper set of intermediate bit-lines to use.

Additionally, the global bit-lines, such as 106 and 108, are differential, so that they carry one bit of information on two complementary wires. Similarly, local bit-lines, such as 118 and 120, are also differential.

In one embodiment of the present invention the high-voltage-swing ranges from 0V to 1.8V, while a low-voltage-swing ranges from 0V to 0.3V. It will be apparent to one skilled in the art that these voltage values are arbitrary and are chosen for the sake of illustration.

In one embodiment of the present invention, during a write, the global bit-line pair, such as 106 and 108, has voltages of 0V and 0.3V, or 0.3V and 0V, respectively, while the local bit-line pair, such as 118 and 120, needs to have voltages of 0V and 1.8V, or 1.8V and 0V, respectively.

Furthermore, before a write, the two local bit-lines 118 and 120 are both pre-charged to 1.8V. Hence, after pre-charging, the two local bit-lines 118 and 120 are clearly not complementary.

Low-Power Memory Write Circuit

Figure 2A:
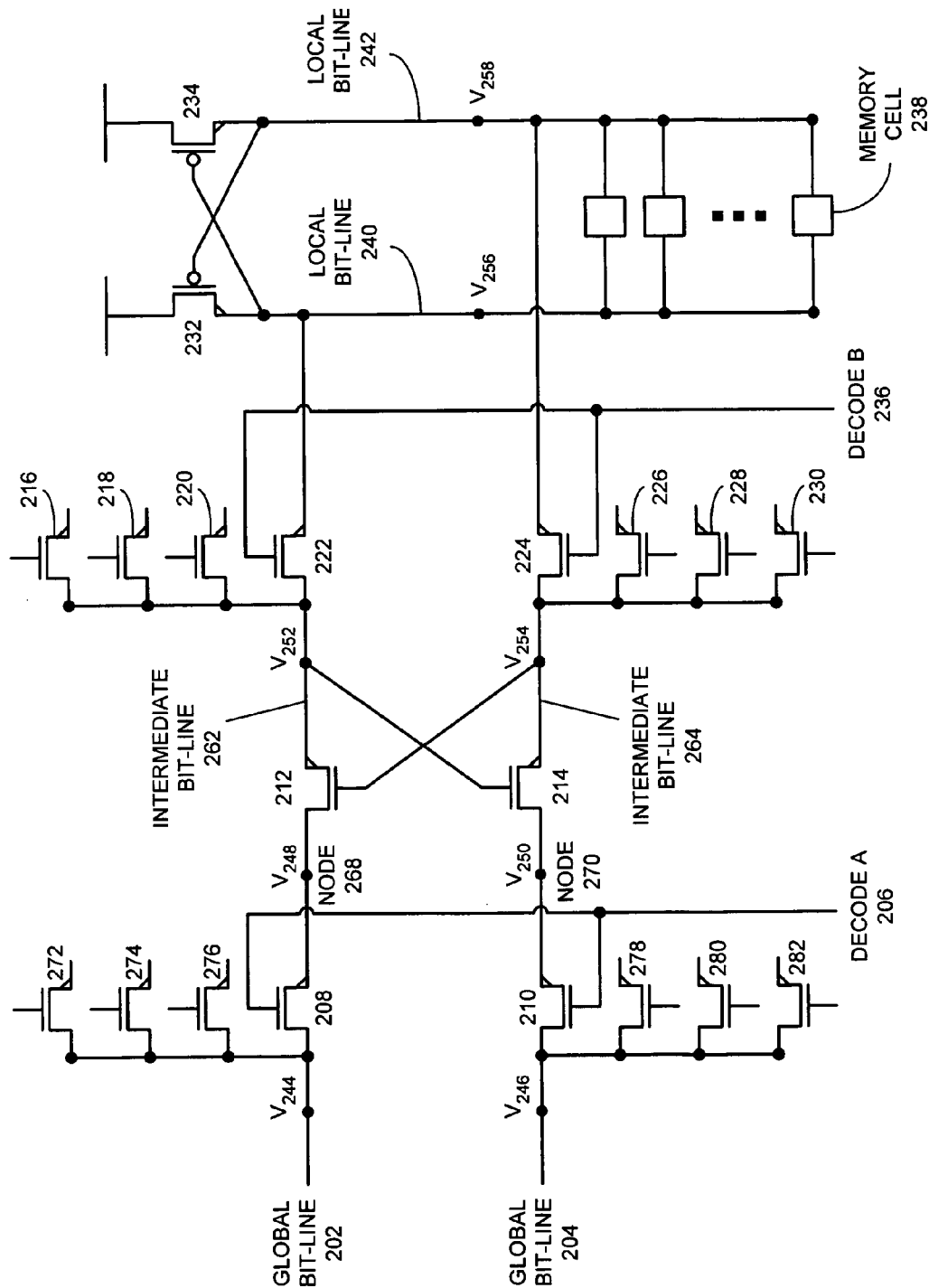
FIG. 2A illustrates a circuit that consumes less power while writing to a memory cell in accordance with an embodiment of the present invention.

FIG. 2A illustrates a circuit that consumes less power while writing to a memory cell in accordance with an embodiment of the present invention.

Transistors 208 and 210 isolate the global bit-lines 202 and 204 from the intermediate bit-lines 262 and 264 and are gate-controlled by the relevant portion of the address decoder 206. They are small, to avoid heavily loading the global bit-lines 202 and 204, thus saving power. (Similarly, transistors 276 and 278, 274 and 280, and 272 and 282 also isolate the global bit-lines 202 and 204 from other intermediate bit-lines that have not been shown in the figure for the sake of clarity. Moreover, the address decoders for these transistors have also not been shown for the sake of clarity.)

Transistors 212 and 214 are a pair of cross-coupled NMOS (N-channel Metal-Oxide-Semiconductor) transistors. They allow a 0V global bit-line, such as global bit-line 202, to pull down the appropriate intermediate bit-line, such as intermediate bit-line 262, but they prevent the 0.3V global bit-line, such as global bit-line 204, from doing the same to its complement intermediate bit-line, such as intermediate bit-line 264. This is because the global bit-line 202 with the 0V value quickly pulls down its particular intermediate bit-line 262, thereby turning off the other NMOS transistor 214, which prevents further discharge of "high" intermediate bit-line 264 or selected local bit-line 242.

Statically driven transistors 216, 218, 220, 222, 224, 226, 228, and 230 form a 4-way multiplexing circuit that couples one pair of local bit-lines out of four pairs of local bit-lines to a pair of intermediate bit-lines. Note that for the sake of clarity, we only illustrate one pair of transistors 222 and 224 in the 4-way multiplexing circuit that is coupled with the pair of local bit-lines 240 and 242. It will be apparent to one skilled in the art that the other transistor pairs, namely 220 and 226, 218 and 228, 216 and 230, can be similarly coupled with other pairs of local bit-lines. During writes of memory cell 238, 0V and 0.3V complementary data is applied to global bit-lines 202 and 204, and decode A 206 is asserted (high for NMOS selection transistor 208 and 210). Cross-coupled NMOS transistors 212 and 214 pull either intermediate bit-line 262 or 264 to ground, the other remaining high. Decode B 236 is simultaneously asserted high to cause the true or complement local bit-line 240 or 242 to go to ground, the other remaining near the positive supply voltage. A word line (not shown) selects memory cell 238 to write.

Note that the present invention is not specific to the number of local bit-lines that are coupled with a global bit-line. Although FIG. 2A illustrates that four local bit-lines are coupled with each intermediate bit-line, and four intermediate bit-lines are coupled to a global bit-line, it will be apparent to one skilled in the art that the number of local bit-lines that are coupled to each intermediate bit-line, and the number of intermediate bit-lines that are coupled to a global bit-line can be more or less.

Cross-coupled PMOS transistors 232 and 234 help maintain a high voltage on whichever local bit-line that does not fall. Note that their presence is not required for the circuit to function. In the absence of transistors 232 and 234, transistors 212 and 214 can still maintain a large enough voltage differential on the local bit-lines 240 and 242 so that the memory cells will be written properly. However, transistors 232 and 234 can help maintain a larger voltage differential, thereby improving the write speed.

To summarize, the low-voltage-swing signal on the global bit-lines is converted to the high-voltage-swing signal on the local bit-lines using a pair of cross-coupled NMOS(N-channel Metal-Oxide-Semiconductor) transistors whose drains are directly or indirectly coupled to the local bit-lines, and whose sources are directly or indirectly coupled to the global bit-lines. For example, the drains of cross-coupled NMOS transistors 212 and 214 are indirectly coupled to the local bit-lines 240 and 242 through the intermediate bit-lines 262 and 264, respectively. On the other hand, the sources of cross-coupled NMOS transistors 212 and 214 are directly coupled to the global bit-lines 202 and 204 via the transistors 208 and 210, respectively. Note that the core of the present invention is embodied by the cross-coupled transistors 212 and 214. They serve two purposes during writes. First, they allow the lower of the two global bit-lines (the one at ground), such as global bit-line 202, to pull its corresponding local bit-line, such as local bit-line 240, down to ground. Second, they isolate the other global bit-line (the one at 0.3V), such as global bit-line 204, and prevent it from significantly pulling down its local bit-line 242. These two actions occur simultaneously because the transistors 212 and 214 are cross-coupled.

Figure 2B:
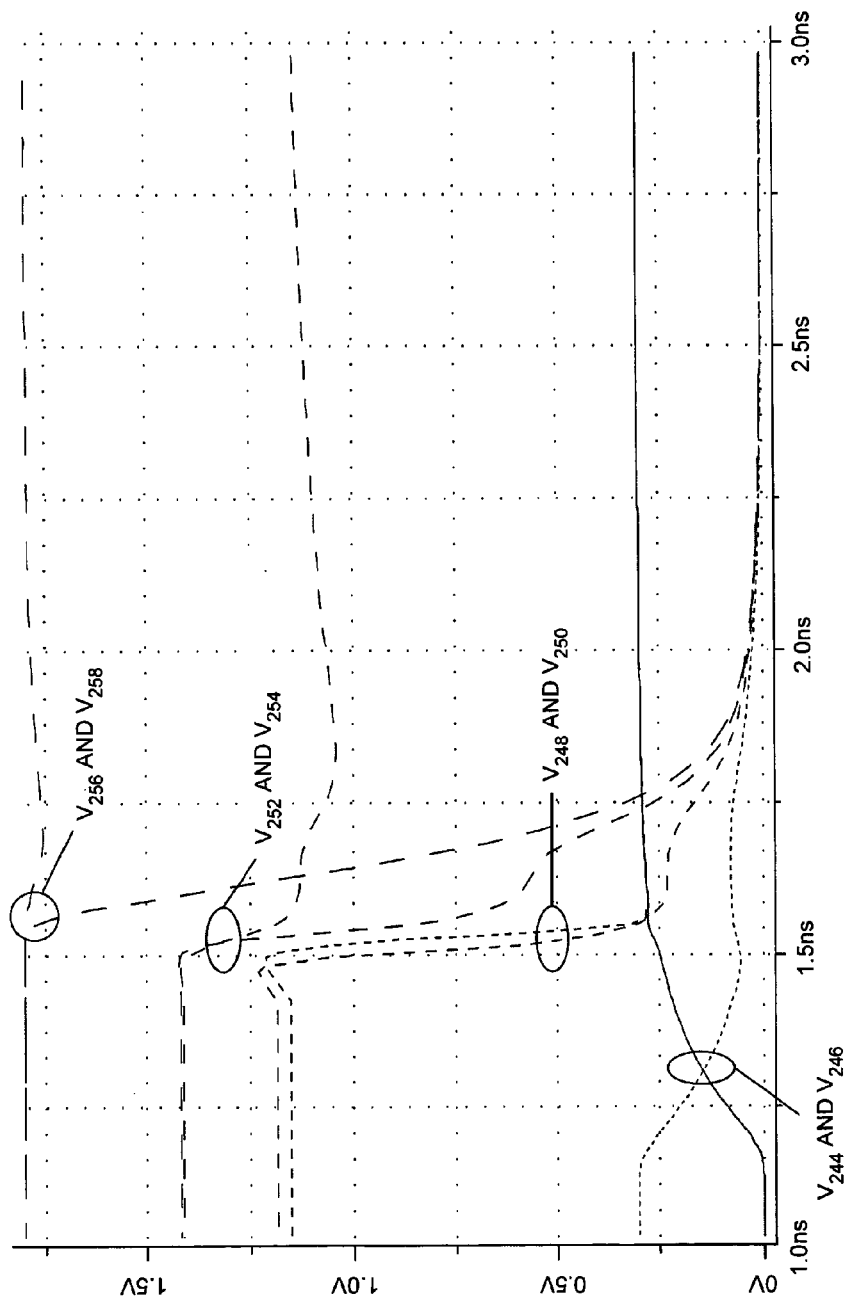
FIG. 2B illustrates the voltage waveforms at various points on the circuit in accordance with an embodiment of the present invention.

FIG. 2B illustrates a plot of the voltage waveforms at various points on the circuit in accordance with an embodiment of the present invention. Note that these waveforms were obtained via simulation. Each voltage waveform in FIG. 2B corresponds to the voltage at a point in the circuit as shown in FIG. 2A. Specifically, waveforms $V_{244}$ and $V_{246}$ correspond to the voltages on global bit-lines 202 and 204, waveforms $V_{256}$ and $V_{258}$ correspond to the voltages on local bit-lines 240 and 242, waveforms $V_{248}$ and $V_{250}$ correspond to the voltages at nodes 268 and 270, and waveforms $V_{252}$ and $V_{254}$ correspond to the voltages at the intermediate bit-lines 262 and 264, respectively.

In one embodiment of the present invention, the waveforms $V_{244}$ and $V_{246}$, which correspond to the voltage on the global bit-lines 202 and 204, swing between 0 and 0.3V and represent the low-voltage-swing signal that the present invention uses to write to the memory. Moreover, note that waveforms $V_{256}$ and $V_{258}$, which correspond to the voltage on the local bit-lines 240 and 242, respectively, are both pre-charged to the full power supply (1.8V in this simulation) by transistors that have not been shown in the figures for clarity purposes, and eventually one of them falls to ground, while the other remains high. It is evident from these waveforms that the present invention maintains a high-voltage-swing signal across the local bit-lines 240 and 242 using a low-voltage-swing signal across the global bit-lines 202 and 204.

Note that the voltage swing (0V–0.3V) of the low-voltage-swing signal across the pair of global bit-lines 202 and 204 is less than the voltage swing required for writing to a cell in a memory. Furthermore, the voltage swing (0V–1.8V) of the high-voltage-swing signal across the pair of local bit-lines 240 and 242 is greater than or equal to the voltage swing required for writing to a cell in a memory.

It will be apparent to one skilled in the art that these voltage values are arbitrary and are chosen for the sake of illustration. For example, in one embodiment of the present invention, the low-voltage-swing can be less than 50% of the voltage difference between the memory's power supply and ground.

Waveforms $V_{248}$ and $V_{250}$ correspond to the voltages at the source terminals of the transistors 212 and 214 that are coupled with the global bit-lines 202 and 204 through selection transistors 208 and 210, respectively. The voltages corresponding to waveforms $V_{248}$ and $V_{250}$ are originally pre-charged to two NMOS threshold drops (one larger than the other due to the body effect) below the power supply. When decode A 206 is asserted high at about 1.5 ns, transistors 208 and 210 are turned on, which causes the low global bit-line to pull the corresponding intermediate and local bit-lines low.

The waveforms $V_{252}$ and $V_{254}$ correspond to the voltages at the intermediate bit-lines 262 and 264. Moreover, waveforms $V_{252}$ and $V_{254}$ also represent the voltages on the gates of the cross-coupled NMOS transistors 214 and 212, respectively. The voltages corresponding to the waveforms $V_{252}$ and $V_{254}$ are originally pre-charged to one NMOS threshold drop below the power supply using pre-charge PMOS devices in parallel with devices 232 and 234 which pull through devices 222 and 224. (Note that, for the sake of clarity, these PMOS devices have not been illustrated in FIG. 2A.) When decoder A 206 is asserted, the voltages corresponding to waveforms $V_{252}$ and $V_{254}$ respond to the voltages on the global bit-lines; one falls and the other degrades only slightly.

To summarize, the present invention provides a method and apparatus for using a low-voltage-swing signal across a pair of global bit-lines to reliably write to a memory cell. By doing this, the present invention can drastically reduce the power consumption of the global bit-lines. For example, a 1.8V memory can potentially save 97% of the global bit-line power by switching its global bit-lines between 0V and an externally supplied voltage of 0.3V, instead of switching them between 0V and 1.8V.

Improved Discharge Path

Figure 3:
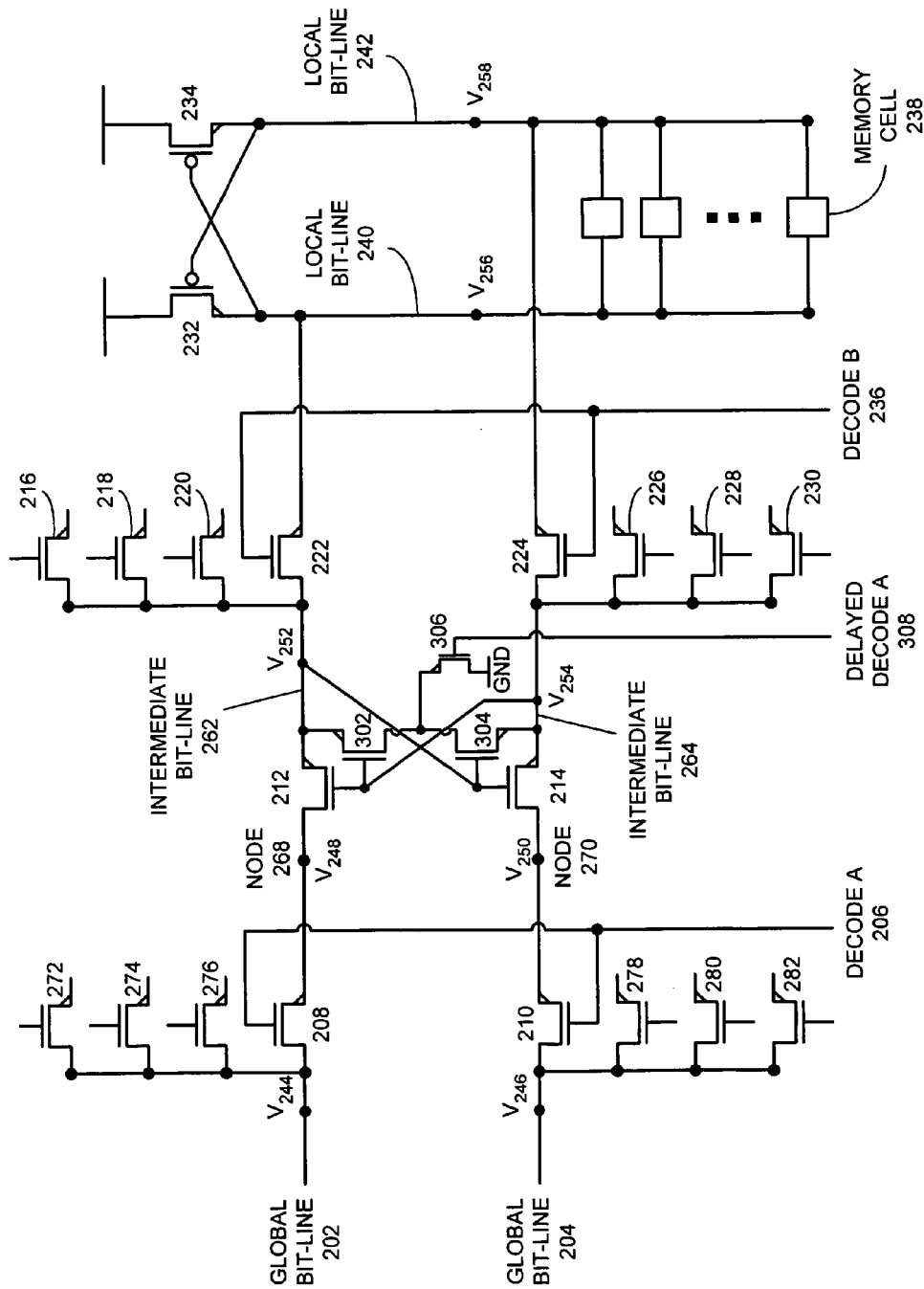
FIG. 3 illustrates an enhancement to the present invention that improves the effectiveness of the global bit-lines in pulling down the local bit-lines in accordance with an embodiment of the present invention.

FIG. 3 illustrates an enhancement to the present invention that improves the effectiveness of the global bit-lines in pulling down the local bit-lines in accordance with an embodiment of the present invention.

Note that in FIG. 2A, the local bit-lines 240 and 242 are discharged through the long global bit-lines 202 and 204 that can have a potentially high impedance due to resistive on-chip wires. This can result in poor write speeds.

FIG. 3 illustrates a variation on the present embodiment, which includes a gate-controlled discharge path that is constructed using NMOS transistor 306 and cross-coupled NMOS transistors 302 and 304.

During operation, transistor 306 is turned on using delayed decode A 308, which is asserted after a fixed delay after decode A 206 is asserted. The intermediate bit-line (either 262 or 264) that falls low enough turns off the corresponding discharge transistor (either 304 or 302), which prevents further discharge of the high intermediate bit-line (either 264 or 262). As a result, transistor 306 and the discharge transistor (either 302 or 304) that is still on create a low-resistance discharge path between the low intermediate bit-line (either 262 or 264) and ground. This discharge path helps to quickly discharge the low intermediate bit-line (either 262 or 264), thereby potentially improving the write speeds.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for writing to a cell in a memory using a low-voltage-swing signal across a pair of global bit-lines, the method comprising:
   receiving a low-voltage-swing signal across a pair of global bit-lines;
   converting the low-voltage-swing signal to a high-voltage-swing signal; and
   writing to the cell in the memory by applying the high-voltage-swing signal across a pair of local bit-lines coupled to the cell in the memory;
   wherein using a low-voltage-swing signal instead of a high-voltage-swing signal across the pair of long and high-capacitance global bit-lines reduces the overall power consumption of the memory.

2. The method of claim 1, wherein converting the low-voltage-swing signal to a high-voltage-swing signal involves using a first pair of cross-coupled NMOS(N-channel Metal-Oxide-Semiconductor) transistors.

3. The method of claim 2, wherein the respective sources of the first pair of cross-coupled NMOS transistors are directly or indirectly coupled to the respective global bit-lines, and wherein the respective drains of the first pair of cross-coupled NMOS transistors are directly or indirectly coupled to the respective local bit-lines.

4. The method of claim 3, wherein the direct or indirect coupling of the sources of the first pair of cross-coupled NMOS transistors to the global bit-lines is facilitated using a pair of selection transistors having a common gate voltage.

5. The method of claim 4, wherein converting the low-voltage-swing signal to the high-voltage-swing signal involves using a second pair of cross-coupled NMOS transistors to quickly discharge a local bit-line in the pair of local bit-lines, thereby quickly creating the high-voltage-swing signal across the pair of local bit-lines.

6. The method of claim 1, wherein a global bit-line in the pair of global bit-lines is coupled to a plurality of intermediate bit-lines.

7. The method of claim 6, wherein an intermediate bit-line in a pair of intermediate bit-lines is coupled to a plurality of local bit-lines.

8. An apparatus for writing to a cell in a memory using a low-voltage-swing signal across a pair of global bit-lines, the apparatus comprising:
   a receiving mechanism configured to receive a low-voltage-swing signal across a pair of global bit-lines;
   a converting mechanism configured to convert the low-voltage-swing signal to a high-voltage-swing signal; and
   a writing mechanism configured to write to the cell in the memory by applying the high-voltage-swing signal across a pair of local bit-lines coupled to the cell in the memory;
   wherein using the low-voltage-swing signal instead of the high-voltage-swing signal across the pair of long and high-capacitance global bit-lines reduces the overall power consumption of the memory.

9. The apparatus of claim 8, wherein the converting mechanism includes a first pair of cross-coupled NMOS(N-channel Metal-Oxide-Semiconductor) transistors.

10. The apparatus of claim 9, wherein the respective sources of the first pair of cross-coupled NMOS transistors are directly or indirectly coupled to the respective global bit-lines, and wherein the respective drains of the first pair of cross-coupled NMOS transistors are directly or indirectly coupled to the respective local bit-lines.

11. The apparatus of claim 10, wherein the direct or indirect coupling of the sources of the first pair of cross-coupled NMOS transistors to the global bit-lines is facilitated using a pair of selection transistors having a common gate voltage.

12. The method of claim 11, wherein the converting mechanism includes a second pair of cross-coupled NMOS transistors to quickly discharge a local bit-line in the pair of local bit-lines, thereby quickly creating the high-voltage-swing signal across the pair of local bit-lines.

13. The apparatus of claim 8, wherein a global bit-line in the pair of global bit-lines is coupled to a plurality of intermediate bit-lines.

14. The apparatus of claim 13, wherein an intermediate bit-line in a pair of intermediate bit-lines is coupled to a plurality of local bit-lines.

15. A computer system that includes a circuit for writing to a cell in a memory using a low-voltage-swing signal across a pair of global bit-lines, the circuit comprising:
- a receiving-circuit configured to receive a low-voltage-swing signal across a pair of global bit-lines;
- a converting-circuit configured to convert the low-voltage-swing signal to a high-voltage-swing signal; and
- a writing-circuit configured to write to the cell in the memory by applying the high-voltage-swing signal across a pair of local bit-lines coupled to the cell in the memory;
- wherein using the low-voltage-swing signal instead of the high-voltage-swing signal across the pair of long and high-capacitance global bit-lines reduces the overall power consumption of the memory.

16. The computer system of claim 15, wherein the converting-circuit includes a first pair of cross-coupled NMOS (N-channel Metal-Oxide-Semiconductor) transistors.

17. The computer system of claim 16, wherein the respective sources of the first pair of cross-coupled NMOS transistors are directly or indirectly coupled to the respective global bit-lines, and wherein the respective drains of the first pair of cross-coupled NMOS transistors are directly or indirectly coupled to the respective local bit-lines.

18. The computer system of claim 17, wherein the direct or indirect coupling of the sources of the first pair of cross-coupled NMOS transistors to the global bit-lines is facilitated using a pair of selection transistors having a common gate voltage.

19. The computer system of claim 18, wherein the converting-circuit includes a second pair of cross-coupled NMOS transistors to quickly discharge a local bit-line in the pair of local bit-lines, thereby quickly creating the high-voltage-swing signal across the pair of local bit-lines.

20. The computer system of claim 15, wherein a global bit-line in the pair of global bit-lines is coupled to a plurality of intermediate bit-lines.

21. The computer system of claim 20, wherein an intermediate bit-line in a pair of intermediate bit-lines is coupled to a plurality of local bit-lines.

* * * * *